United States Patent
Yamada et al.

(10) Patent No.: US 11,516,951 B2
(45) Date of Patent: Nov. 29, 2022

(54) NOISE SUPPRESSION SHEET

(71) Applicant: TDK CORPORATION, Tokyo (JP)

(72) Inventors: Takashi Yamada, Tokyo (JP); Atsushi Sato, Tokyo (JP); Makoto Orikasa, Tokyo (JP); Hideharu Moro, Tokyo (JP)

(73) Assignee: TDK CORPORATION, Tokyo (JP)

( * ) Notice: Subject to any disclaimer, the term of this patent is extended or adjusted under 35 U.S.C. 154(b) by 284 days.

(21) Appl. No.: 16/876,583

(22) Filed: May 18, 2020

(65) Prior Publication Data

US 2021/0360839 A1 Nov. 18, 2021

(51) Int. Cl.
*H01L 23/552* (2006.01)
*H05K 9/00* (2006.01)

(52) U.S. Cl.
CPC ......... *H05K 9/0088* (2013.01); *H05K 9/0075* (2013.01)

(58) Field of Classification Search
CPC combination set(s) only.
See application file for complete search history.

(56) References Cited

U.S. PATENT DOCUMENTS

| 4,818,606 | A  | * | 4/1989  | Koyama    | G11B 5/714   |
|-----------|----|---|---------|-----------|--------------|
| 5,604,013 | A  | * | 2/1997  | Yamaguchi | G11B 5/825   |
| 5,635,294 | A  | * | 6/1997  | Michihata | G11B 5/714   |
|           |    |   |         |           | 428/323      |
| 2003/0218225 | A1 | * | 11/2003 | Nagai  | G11B 5/8408  |
| 2005/0074633 | A1 | * | 4/2005  | Lee    | G11B 5/8404  |
|           |    |   |         |           | 428/128      |
| 2010/0221582 | A1 | * | 9/2010  | Kawai  | G11B 5/73921 |
|           |    |   |         |           | 428/846      |

* cited by examiner

*Primary Examiner* — Niki H Nguyen
(74) *Attorney, Agent, or Firm* — Oliff PLC

(57) ABSTRACT

A noise suppression sheet comprises at least one composite layer, the composite layer including: an insulating resin layer; a non-magnetic metal layer formed on the insulating resin layer; and a metal magnetic layer formed on the non-magnetic metal layer, and the composite layer has a through hole. When the noise suppression sheet comprises a plurality of composite layers, the through holes are misaligned in adjacent composite layers in the laminating direction.

3 Claims, 2 Drawing Sheets

NOISE SUPPRESSION SHEET

TECHNICAL FIELD

The present disclosure relates to a noise suppression sheet.

BACKGROUND

In recent years, along with increasing operation speed of a digital circuit in an electronic apparatus, erroneous operation of the electronic apparatus or an adverse effect on a human body caused by noise such as electromagnetic waves generated from the circuit has been deepening. For this reason, development of a noise suppression sheet for suppressing (blocking) noise has been progressed.

SUMMARY

The inventors have conducted research on a noise suppression sheet, and as a result, have found a noise suppression sheet having a novel configuration.

The present disclosure provides a noise suppression sheet having a novel configuration.

The noise suppression sheet according to an embodiment of the present disclosure comprises at least one composite layer, the composite layer including: an insulating resin layer; a non-magnetic metal layer formed on the insulating resin layer; and a metal magnetic layer formed on the non-magnetic metal layer, and the composite layer has a through hole.

The noise suppression sheet according to another embodiment comprises a plurality of composite layers, and the through holes are misaligned in adjacent composite layers in the laminating direction.

In the noise suppression sheet according to another embodiment, the inner side surface of the through hole has a multilayer structure.

DETAILED DESCRIPTION

Some embodiments of the present disclosure are described below, with reference as necessary to the drawings. However, the present disclosure is not limited to the following embodiments.

Figure 1:
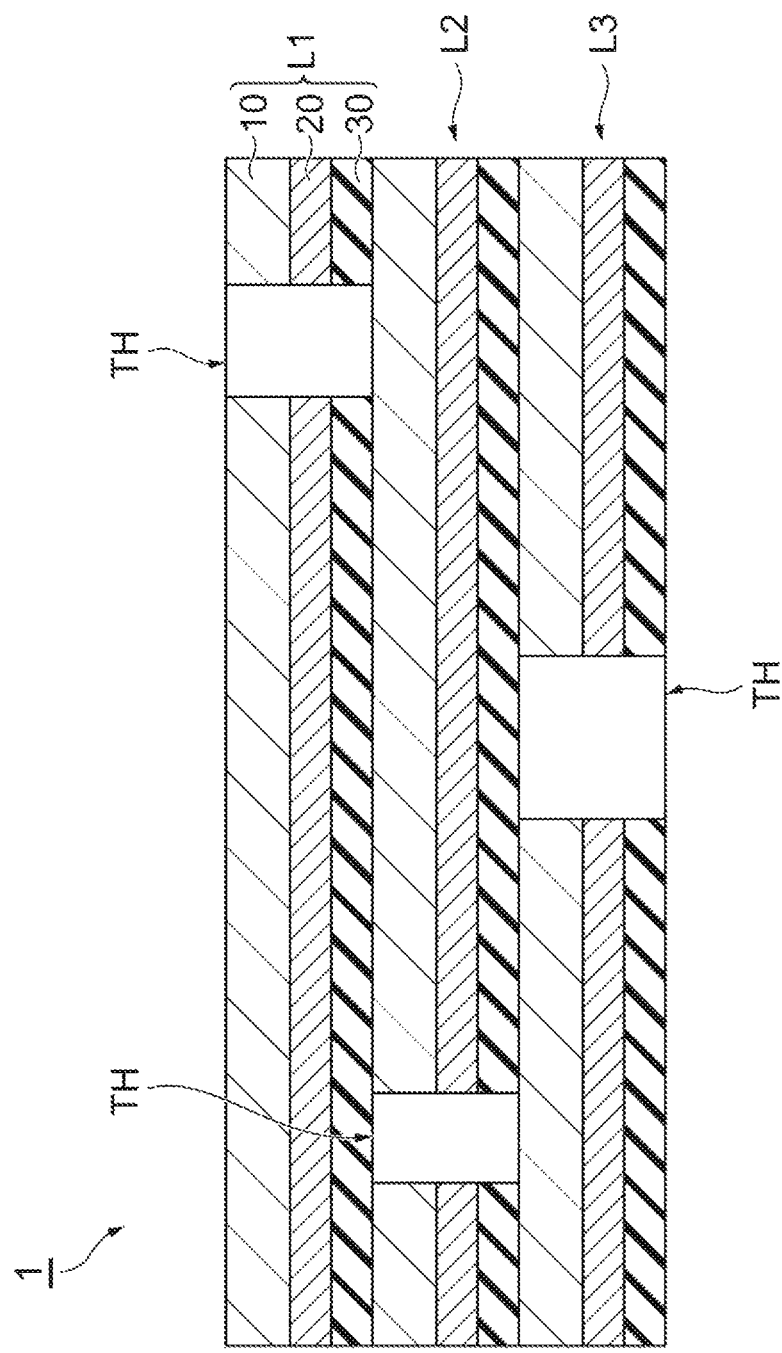
FIG. 1 is a schematic sectional view showing one embodiment of a noise suppression sheet.

FIG. 1 is a schematic sectional view showing one embodiment of a noise suppression sheet. The noise suppression sheet 1 shown in FIG. 1 is composed of a plurality of composite layers L1, L2, and L3. Specifically, the noise suppression sheet 1 has a laminated structure consisting of three composite layers L1, L2, and L3. From the viewpoint of thinning, the noise suppression sheet 1 is designed so that its thickness is 100 μm or less.

Each of the composite layer L1, L2, and L3 is composed of an insulating resin layer 10, a non-magnetic metal layer 20 formed on the insulating resin layer 10, and a metal magnetic layer 30 formed on the non-magnetic metal layer 20. Each of the composite layer L1, L2, and L3 has a plurality of through holes TH. As shown in FIG. 1, the through holes TH are misaligned in the adjacent composite layers L1, L2, and L3 in the laminating direction. The planar shape of each through hole TH is substantially circular, and has a diameter of 30 μm as an example.

Figure 2:
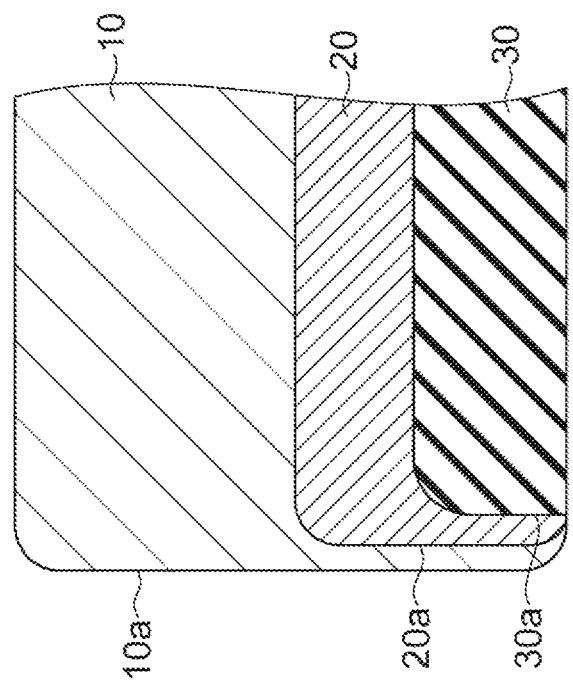
FIG. 2 is an enlarged view of a main part of FIG. 1.
Figure 2:
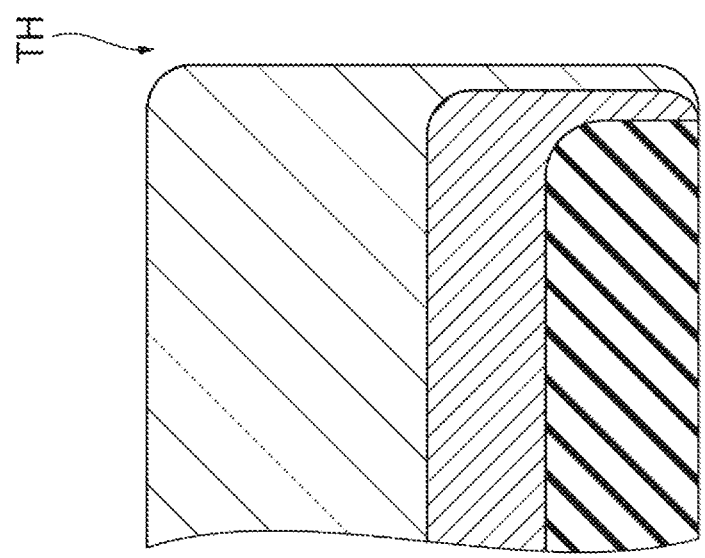

The insulating resin layer 10 is a thin film composed of an insulating resin material, and for example is composed of polypyrrole. As shown in FIG. 2, a plurality of voids V is provided in the insulating resin layer 10. In the insulating resin layer 10, for example, one or more voids V are provided in an area of 1 cm square. In the present embodiment, the thickness of the insulating resin layer 10 is designed to be 0.5 to 3.0 μm (for example, 1.0 μm).

The non-magnetic metal layer 20 is a thin film composed of a non-magnetic metal. Examples of the non-magnetic metal constituting the non-magnetic metal layer 20 include Cu, Al, Sn, and Bi. The non-magnetic metal layer 20 may be composed of a single non-magnetic metal or a plurality of non-magnetic metals having different metal species. The non-magnetic metal layer 20 according to the present embodiment is composed of at least one selected from the group consisting of Cu and Al. The thickness of the non-magnetic metal layer 20 is designed to be 0.5 to 5.0 μm (for example, 1.5 μm). The non-magnetic metal layer 20 functions as an electromagnetic wave shield that reflects electromagnetic noise.

In the present embodiment, the non-magnetic metal layer 20 is provided so as to cover the inner side surface 10a of the void V of the insulating resin layer 10, as shown in FIG. 2.

The metal magnetic layer 30 is a thin film composed of a magnetic material, and is composed of, for example, an FeNi alloy (permalloy) or an FeSiAl alloy (sendust). In the present embodiment, the metal magnetic layer 30 is composed of an FeNi alloy containing 70 to 84 wt % of Ni and 16 to 30 wt % of Fe. The thickness of the metal magnetic layer 30 is designed to be 0.5 to 5.0 μm (for example, 2.0 μm). The metal magnetic layer 30 has high magnetic permeability and can function as a magnetic shield layer that absorbs noise.

In the present embodiment, the metal magnetic layer 30 is provided so as to cover the inner side surface 20a of the non-magnetic metal layer 20 at the position of the void V, as shown in FIG. 2.

The metal magnetic layer 30 is designed to have a high electrical resistivity, and the electrical resistivity of the metal magnetic layer 30 according to the present embodiment is 70 to 115 μΩ·cm (for example, 95 μΩ·cm).

The above noise suppression sheet 1 can absorb and suppress noise (magnetism, electromagnetic waves, and the like) generated from a circuit or the like in an electronic component by being mounted on the electronic component or the like. In the noise suppression sheet 1, noise is absorbed by the metal magnetic layer 30. Noise that is transmitted without being absorbed by the metal magnetic layer 30 can be reflected by the non-magnetic metal layer 20 and can be absorbed again by the metal magnetic layer 30, and hence the noise suppression sheet 1 can suppress noise effectively.

Moreover, according to the noise suppression sheet 1, an excellent magnetic shielding characteristic is achievable. In the noise suppression sheet 1, particularly, a high electrical resistivity of 70 to 115 μΩ·cm is achieved in the metal magnetic layer 30, high magnetic permeability is maintained even in a high frequency band of about 1 MHz to 10 MHz, and the frequency dependence of the dielectric constant is reduced.

The noise suppression sheet 1 has high magnetic shield characteristics, and hence it can be thinned while maintaining practically sufficient magnetic shield characteristics as a noise suppression sheet.

The noise suppression sheet 1 has three composite layers, but may have a configuration having one, two, or four or more layers.

The method for obtaining the above noise suppression sheet 1 is not particularly limited, and various methods can be adopted.

For example, a film of the insulating resin layer 10 is formed on a substrate such as PET film, and then the non-magnetic metal layer 20 and the metal magnetic layer 30 are sequentially formed by plating or the like, and thereafter, the substrate is removed to obtain each of the composite layer L1, L2, and L3. Overlapping the composite layers L1, L2, and L3 thus obtained provides the noise suppression sheet 1.

When the non-magnetic metal layer 20 and the metal magnetic layer 30 are formed into films on the insulating resin layer 10, the non-magnetic metal layer 20 and the metal magnetic layer 30 are formed so as to cover the voids V provided in the insulating resin layer 10, thereby forming through holes TH penetrating through the composite layers L1, L2, and L3 at the locations of the voids V in the insulating resin layer 10. The inner side surface of the through hole TH has a multilayer structure, and the inner side surface of the through hole TH is composed of the inner side surface 30a of the metal magnetic layer 30.

In the noise suppression sheet 1, each of the composite layers L1, L2, and L3 has the through hole TH and air escapes from the through hole TH when the composite layers L1, L2, and L3 are overlapped, thereby effectively avoiding a situation in which air layers (depletion layers) generate between the layers of the composite layers L1, L2, and L3.

What is claimed is:

1. A noise suppression sheet comprising at least one composite layer, the at least one composite layer including: an insulating resin layer; a non-magnetic metal layer formed on the insulating resin layer; and a metal magnetic layer formed on the non-magnetic metal layer,
   wherein the at least one composite layer has a through hole.
2. The noise suppression sheet according to claim 1, comprising a plurality of the composite layers,
   wherein through holes are misaligned in adjacent composite layers in the laminating direction.
3. The noise suppression sheet according to claim 1, wherein an inner side surface of the through hole has a multilayer structure.

* * * * *